United States Patent
Liu et al.

(10) Patent No.: US 7,326,622 B2
(45) Date of Patent: Feb. 5, 2008

(54) METHOD OF MANUFACTURING SEMICONDUCTOR MOS TRANSISTOR DEVICE

(75) Inventors: Yi-Cheng Liu, Taipei (TW); Jiunn-Ren Hwang, Hsin-Chu (TW); Wei-Tsun Shiau, Kao-Hsiung Hsien (TW); Cheng-Tung Huang, Kao-Hsiung (TW); Kuan-Yang Liao, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/164,031

(22) Filed: Nov. 8, 2005

(65) Prior Publication Data

US 2006/0094195 A1 May 4, 2006

Related U.S. Application Data

(62) Division of application No. 10/904,210, filed on Oct. 28, 2004.

(51) Int. Cl.
*H01L 21/336* (2006.01)
(52) U.S. Cl. ............... 438/301; 257/E21.336; 257/E21.345; 257/E21.634
(58) Field of Classification Search .......... 438/3, 438/301
See application file for complete search history.

(56) References Cited

U.S. PATENT DOCUMENTS

| | | | |
|---|---|---|---|
| 5,496,750 A * | 3/1996 | Moslehi | 438/297 |
| 5,741,725 A * | 4/1998 | Inoue et al. | 438/664 |
| 5,989,966 A * | 11/1999 | Huang | 438/305 |
| 6,214,709 B1 * | 4/2001 | Chen | 438/586 |
| 6,297,117 B1 | 10/2001 | Yu | |
| 6,362,082 B1 * | 3/2002 | Doyle et al. | 438/523 |
| 6,551,870 B1 | 4/2003 | Ling et al. | |
| 6,861,318 B2 * | 3/2005 | Murthy et al. | 438/299 |
| 6,902,680 B2 * | 6/2005 | Collasius et al. | 210/772 |
| 6,902,980 B2 * | 6/2005 | Wang et al. | 438/305 |
| 6,930,007 B2 | 8/2005 | Bu et al. | |
| 6,946,371 B2 * | 9/2005 | Langdo et al. | 438/481 |
| 6,960,512 B2 * | 11/2005 | Cheng et al. | 438/305 |
| 6,960,781 B2 | 11/2005 | Currie et al. | |
| 7,001,844 B2 | 2/2006 | Chakravarti et al. | |
| 7,002,209 B2 | 2/2006 | Chen et al. | |
| 7,023,046 B2 | 4/2006 | Ngo | |

(Continued)

FOREIGN PATENT DOCUMENTS

WO 2004/049406 A1 6/2004

*Primary Examiner*—Walter Lindsay, Jr.
*Assistant Examiner*—Thu-Huong Dinh
(74) *Attorney, Agent, or Firm*—Winston Hsu

(57) ABSTRACT

A method of manufacturing a metal-oxide-semiconductor (MOS) transistor device is disclosed. A semiconductor substrate having a main surface is prepared. A gate dielectric layer is formed on the main surface. A gate electrode is patterned on the gate dielectric layer. The gate electrode has vertical sidewalls and a top surface. A liner is formed on the vertical sidewalls of the gate electrode. A silicon nitride spacer is formed on the liner. The main surface is then ion implanted using the gate electrode and the silicon nitride spacer as an implantation mask, thereby forming a source/drain region of the MOS transistor device in the main surface. The silicon nitride spacer is removed. A silicon nitride cap layer that borders the liner is deposited. The silicon nitride cap layer has a specific stress status.

8 Claims, 9 Drawing Sheets

U.S. PATENT DOCUMENTS

| | | |
|---|---|---|
| 2002/0081794 A1 | 6/2002 | Ito |
| 2004/0132259 A1 | 7/2004 | Yang |
| 2004/0142545 A1 | 7/2004 | Ngo |
| 2004/0188670 A1 | 9/2004 | Shaheed |
| 2006/0068541 A1 | 3/2006 | Chidambaram et al. |

* cited by examiner

US 7,326,622 B2

METHOD OF MANUFACTURING SEMICONDUCTOR MOS TRANSISTOR DEVICE

CROSS REFERENCE TO RELATED APPLICATIONS

This is a divisional application of U.S. patent application Ser. No. 10/904,210, filed Oct. 28, 2004.

BACKGROUND OF THE INVENTION

1. Field of the Invention

The present invention generally relates to the field of semiconductor transistor devices, and more particularly to a method of manufacturing silicon nitride spacer-less semiconductor NMOS and PMOS transistor devices having improved saturation current (Idsat).

2. Description of the Prior Art

High-speed metal-oxide-semiconductor (MOS) transistor devices have been proposed in which a strained silicon (Si) layer, which has been grown epitaxially on a Si wafer with a silicon germanium (SiGe) layer disposed therebetween, is used for the channel area. In this type of strained Si-FET, a biaxial tensile strain occurs in the silicon layer due to the SiGe which has a larger lattice constant than Si, and as a result, the Si band structure alters, the degeneracy is lifted, and the carrier mobility increases. Consequently, using this strained Si layer for a channel area typically enables a 1.5 to 8-fold speed increase.

FIGS. 1-3 are schematic cross-sectional diagrams illustrating a prior art method of fabricating a semiconductor NMOS transistor device 10. As shown in FIG. 1, the conventional NMOS transistor device 10 generally includes a semiconductor substrate generally comprising a silicon layer 16 having a source 18 and a drain 20 separated by a channel region 22. The silicon layer 16 is typically a strained silicon layer formed by epitaxially growing a silicon layer on a SiGe layer (not shown). Ordinarily, the source 18 and drain 20 further border a shallow-junction source extension 17 and a shallow-junction drain extension 19, respectively. A thin oxide layer 14 separates a gate 12, generally comprising polysilicon, from the channel region 22.

In the device 10 illustrated in FIG. 1, the source 18 and drain 20 are N+ regions having been doped by arsenic, antimony or phosphorous. The channel region 22 is generally boron doped. A silicon nitride spacer 32 is formed on sidewalls of the gate 12. A liner 30, generally comprising silicon dioxide, is interposed between the gate 12 and the silicon nitride spacer 32. A salicide layer 42 is selectively formed on the exposed silicon surface of the device 10. Fabrication of an NMOS transistor such as the device 10 illustrated in FIG. 1 is well known in the art and will not be discussed in detail herein.

Referring to FIG. 2, after forming the NMOS transistor device 10, a silicon nitride cap layer 46 is typically deposited thereon. As shown in FIG. 2, the silicon nitride cap layer 46 covers the salicide layer 42 and the silicon nitride spacer 32. The thickness of the silicon nitride cap layer 46 is typically in the range of between 200 angstroms and 400 angstroms for subsequent etching stop purposes. A dielectric layer 48 such as silicon oxide or the like is deposited over the silicon nitride cap layer 46. The dielectric layer 48 is typically much thicker than the silicon nitride cap layer 46.

Referring to FIG. 3, subsequently, conventional lithographic and etching processes are carried out to form a contact hole 52 in the dielectric layer 48 and in the silicon nitride cap layer 46. As aforementioned, the silicon nitride cap layer 46 acts as an etching stop layer during the dry etching process to alleviate source/drain damages caused by the etchant substances.

However, prior art techniques involving the deposition of a graded SiGe layer underneath the silicon channel have several drawbacks. The SiGe layer tends to introduce defects, sometimes called threading dislocations, in the silicon, which can impact yields significantly. Also, the graded SiGe layer is deposited across the wafer, making it harder to optimize the NMOS and PMOS transistors separately. And the silicon germanium layer has poor thermal conductivity. Another concern with the conventional approach is that some dopants diffuse more rapidly through the SiGe layer, resulting in a non-optimium diffusion profile in the source/drain regions.

Thus, a need exists in this industry to provide an inexpensive method for making a MOS transistor device having improved functionality and performance.

SUMMARY OF THE INVENTION

It is the primary object of the present invention to provide a method of manufacturing a silicon nitride spacer-less semiconductor MOS transistor devices having improved performance.

According to the claimed invention, a method of manufacturing a metal-oxide-semiconductor (MOS) transistor device is disclosed. A semiconductor substrate having a main surface is prepared. A gate dielectric layer is formed on the main surface. A gate electrode is patterned on the gate dielectric layer. The gate electrode has vertical sidewalls and a top surface. A liner is formed on the vertical sidewalls of the gate electrode. A silicon nitride spacer is formed on the liner. The main surface is then ion implanted using the gate electrode and the silicon nitride spacer as an implantation mask, thereby forming a source/drain region of the MOS transistor device in the main surface. The silicon nitride spacer is removed. A silicon nitride cap layer that borders the liner is formed on the liner. The silicon nitride cap layer has a specific stress status.

From one aspect of the present invention, a MOS transistor device is provided. The MOS transistor device includes a semiconductor substrate having a main surface; a gate dielectric layer on the main surface; a gate electrode on the gate dielectric layer, wherein the gate electrode has vertical sidewalls and a top surface; a liner on the vertical sidewalls of the gate electrode; a source region in the main surface; and a drain region separated from the source region by a channel region under the gate electrode. The channel region is strained by a stressed silicon nitride cap layer, which borders the liner.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
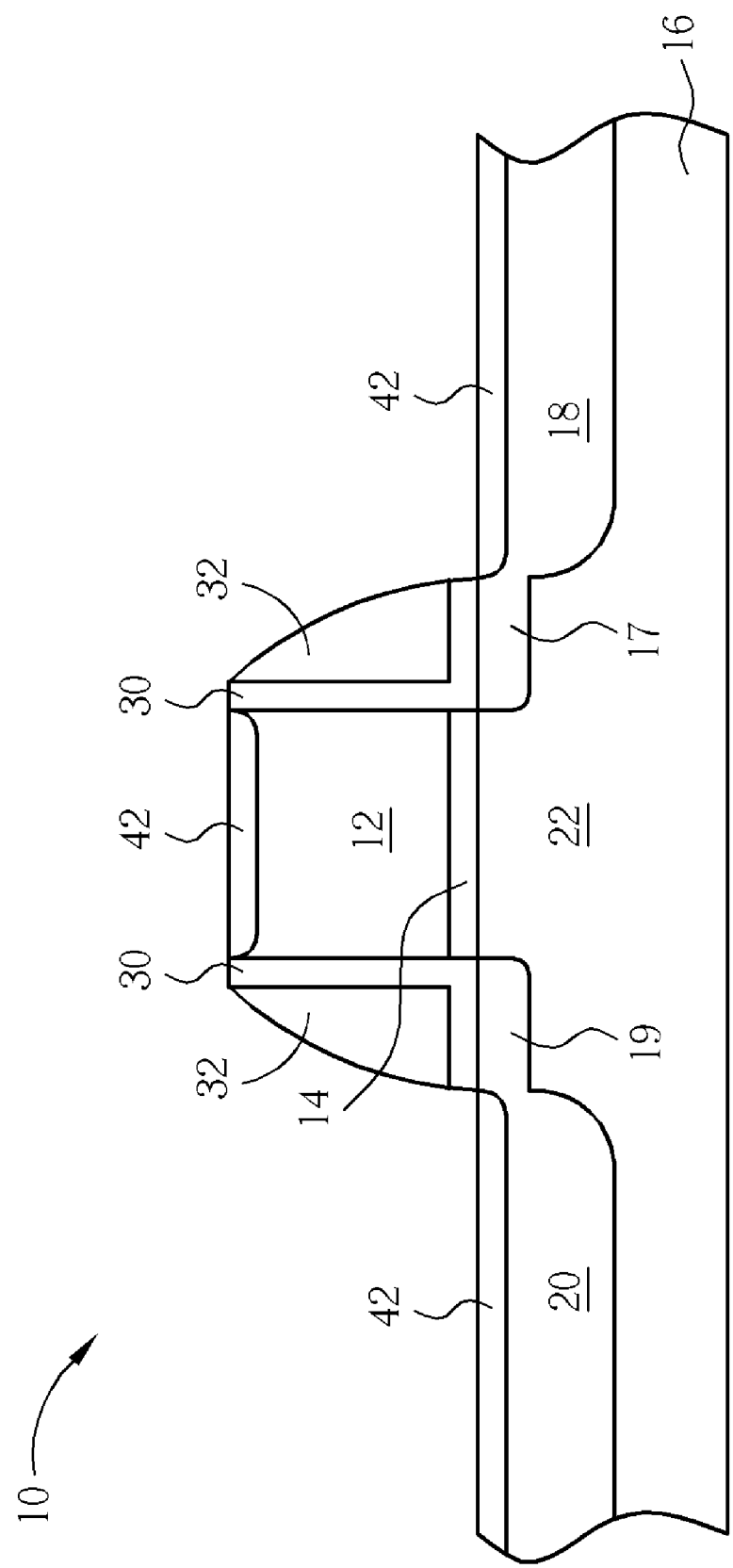
FIGS. 1-3 are schematic cross-sectional diagrams illustrating a prior art method of fabricating a semiconductor NMOS transistor device.
Figure 2:
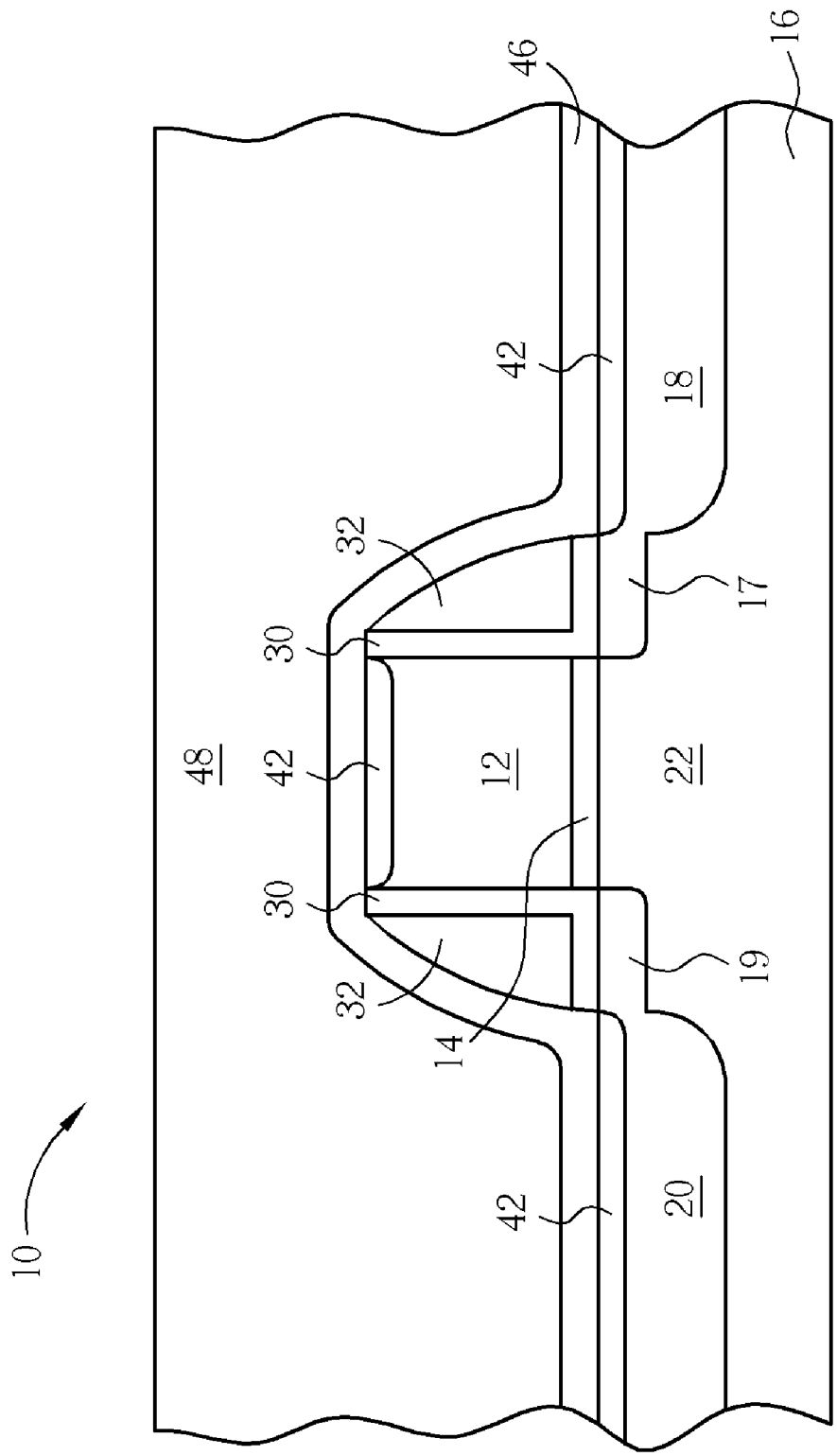
Figure 3:
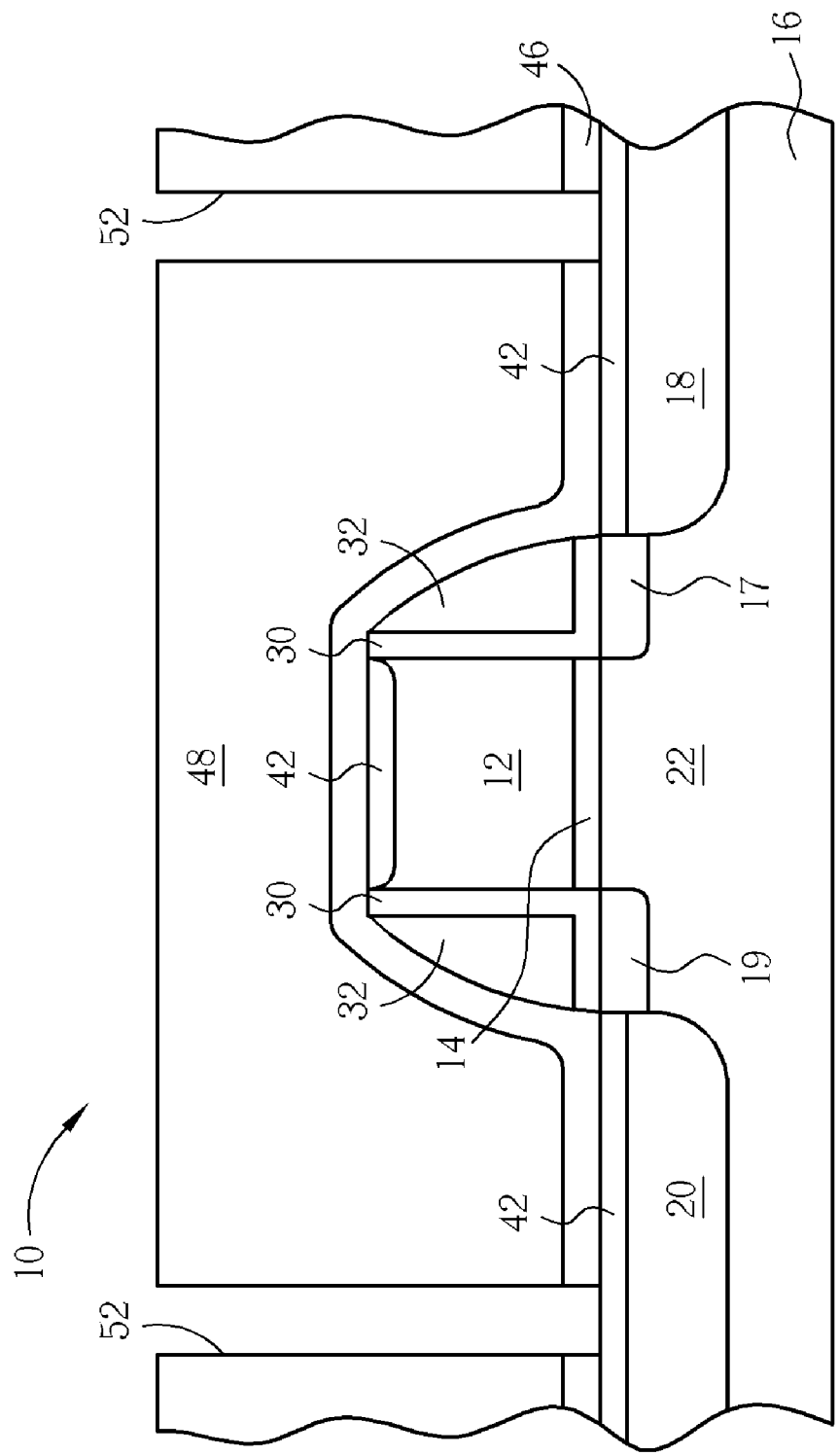

Please refer to FIGS. 4-9. FIGS. 4-9 are schematic cross-sectional diagrams illustrating a method of fabricating semiconductor MOS transistor devices 10 and 100 in accordance with one preferred embodiment of the present invention, wherein like number numerals designate similar or the same parts, regions or elements. It is to be understood that the drawings are not drawn to scale and are served only for illustration purposes. It is to be understood that some lithographic and etching processes relating to the present invention method are known in the art and thus not explicitly shown in the drawings.

Figure 4:
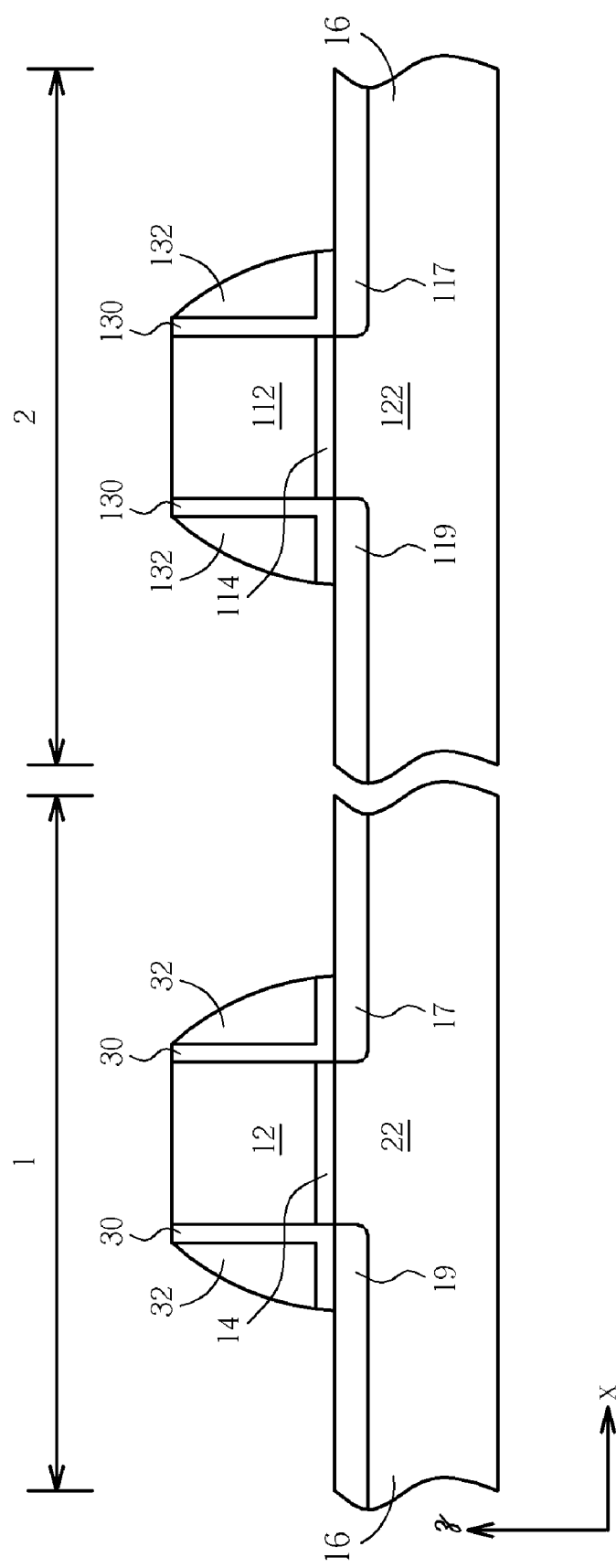
FIGS. 4-9 are schematic cross-sectional diagrams illustrating a method of fabricating semiconductor MOS transistor devices in accordance with one preferred embodiment of the present invention.

The present invention pertains to a method of fabricating MOS transistor devices or CMOS devices of integrated circuits. A CMOS process is demonstrated through FIGS. 4-9. As shown in FIG. 4, a semiconductor substrate generally comprising a silicon layer 16 is prepared, wherein region 1 thereof is used to fabricate an NMOS device 10, while region 2 is used to fabricate a PMOS device 100. According to this invention, the semiconductor substrate may be a silicon substrate or a silicon-on-insulator (SOI) substrate, but not limited thereto. A shallow-junction source extension 17 and a shallow-junction drain extension 19 are formed in the silicon layer 16 within the region 1. The source extension 17 and drain extension 19 are separated by N channel 22. In region 2, likewise, a shallow-junction source extension 117 and a shallow-junction drain extension 119 are formed in the silicon layer 16 and are separated by P channel 122.

A thin oxide layer 14 and 114 separate gates 12 and 112 from the channels 22 and 122, respectively. The gates 12 and 112 generally comprise polysilicon. The oxide layer 14 and 114 may be made of silicon dioxide. However, in another case, the oxide layer 14 and 114 may be made of high-k materials known in the art. Silicon nitride spacers 32 and 132 are formed on respective sidewalls of the gates 12 and 112. Liners 30 and 130 such as silicon dioxide are interposed between the silicon nitride spacer and the gate. The liners 30 and 130 are typically L shaped and have a thickness of about 30~120 angstroms. The liners 30 and 130 may further comprise an offset spacer that is known in the art and is thus omitted in the figures. An x-z coordinate is specifically demonstrated through FIG. 4 to FIG. 9, wherein x-axis represents channel direction between the shallow-junction source extension 17 and a shallow-junction drain extension 19, z-axis represents the direction between the channel and gate.

Figure 5:
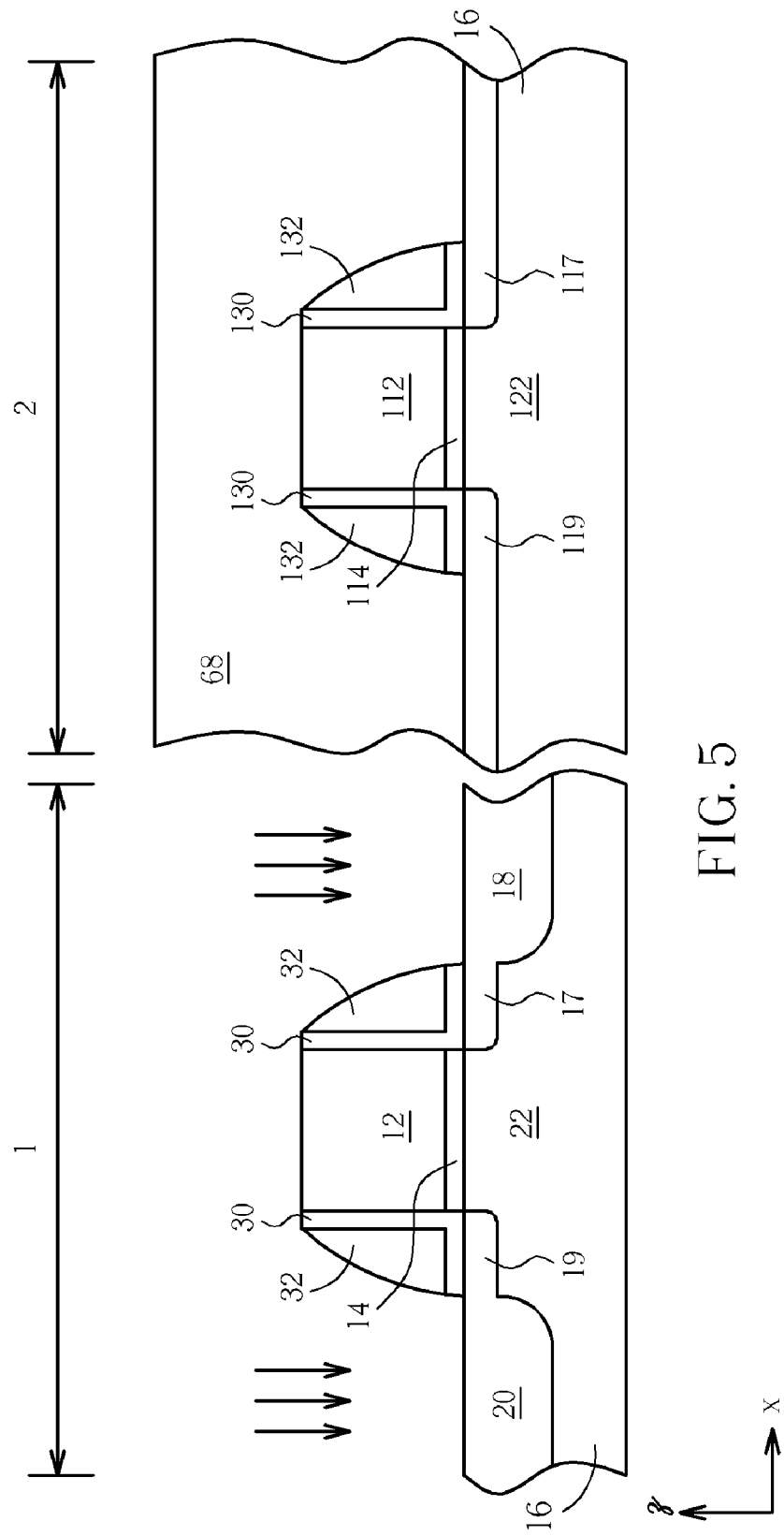

As shown in FIG. 5, after forming the silicon nitride spacers 32 and 132, a mask layer 68 such as a photo resist layer is formed to mask the region 2 only. An ion implantation process is carried out to dope N type dopant species such as arsenic, antimony or phosphorous into the silicon layer 16, thereby forming source region 18 and drain region 20. The mask layer 68 is then stripped off.

Figure 6:
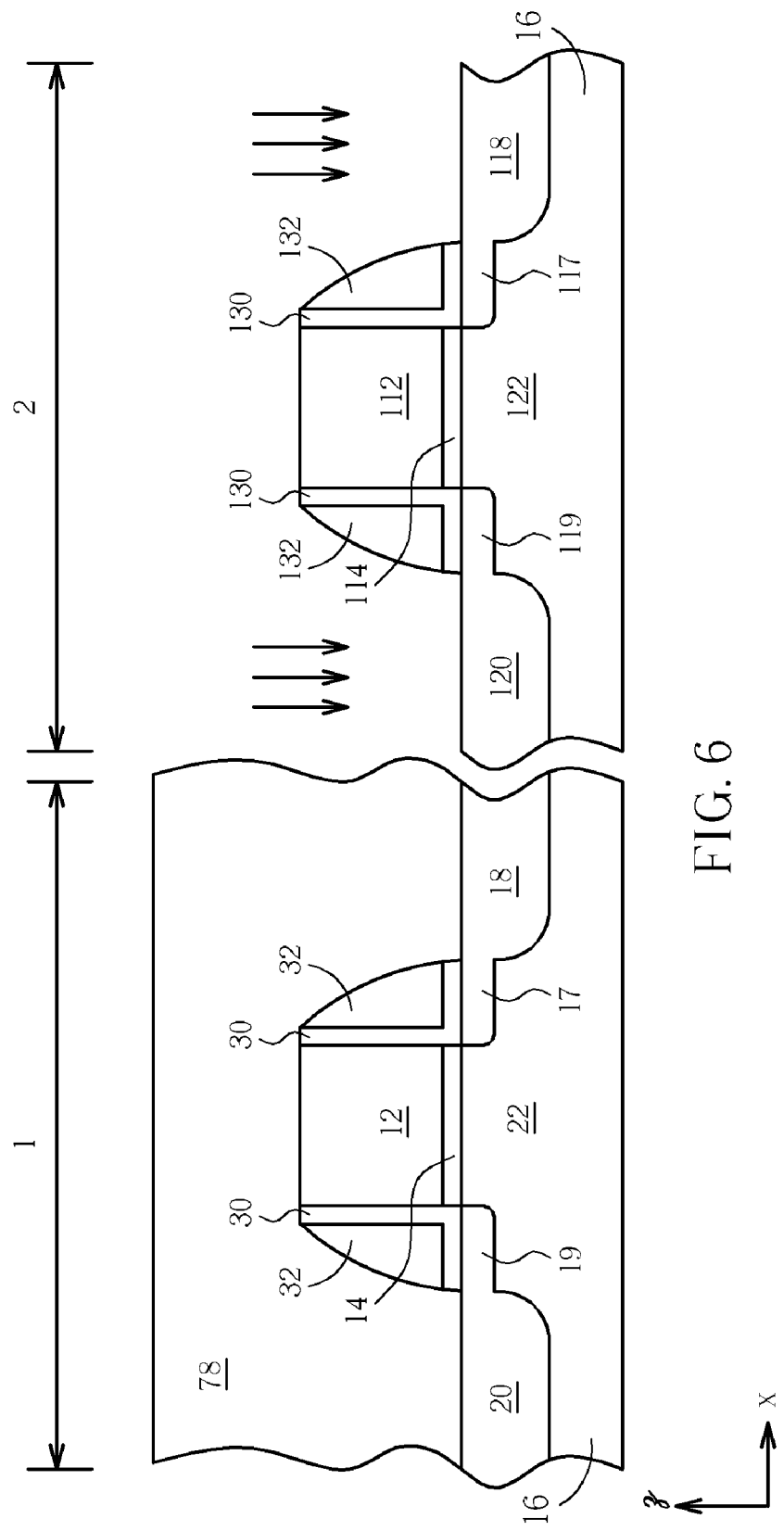

As shown in FIG. 6, a mask layer 78 such as a photo resist layer is formed to only mask the region 1. An ion implantation process is carried out to dope P type dopant species such as boron into the silicon layer 16, thereby forming source region 118 and drain region 120. The mask layer 78 is then stripped off using methods known in the art. It is to be understood that the sequence as set forth in FIGS. 5 and 6 may be converse. That is, the P type doping for the region 2 may be carried out first, then the N type doping for the region 1. After the source/drain doping, the substrate may be subjected to an annealing and/or activation thermal process that is known in the art.

Figure 7:
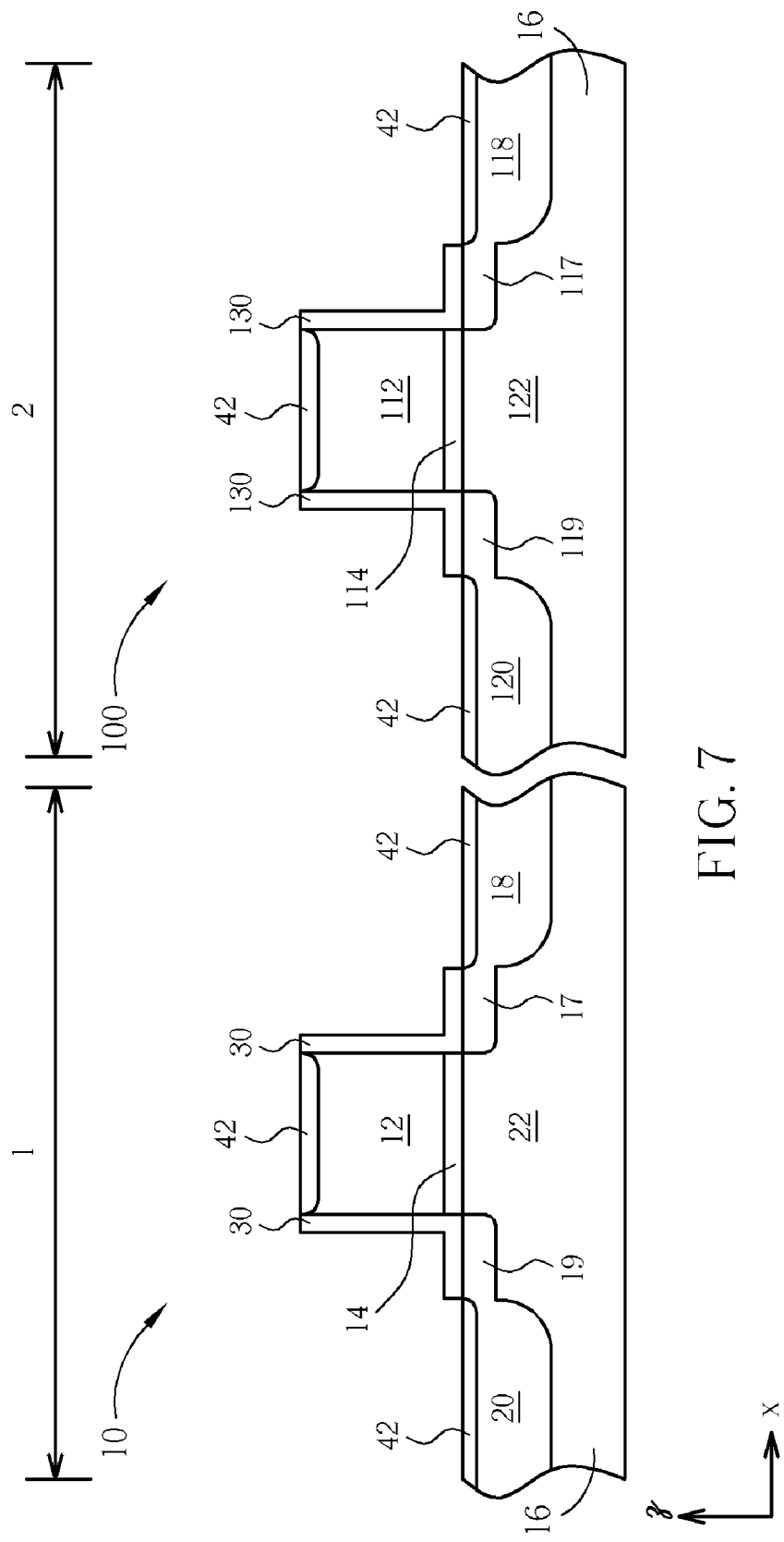

As shown in FIG. 7, a conventional salicide process is performed to form a salicide layer 42 such as nickel salicide layer on the gates 12 and 122, on the exposed source regions 18 and 118 and on the exposed drain regions 20 and 120. Subsequently, the silicon nitride spacers 32 and 132 are stripped away, leaving the liners 30 and 130 on the sidewalls intact. According to one preferred embodiment, phosphoric acid is employed to remove the silicon nitride spacers 32 and 132. The present invention features that both the NMOS transistor device 10 and the PMOS transistor device 100 do not have silicon nitride spacers (silicon nitride spacer-less) compared to the prior art MOS transistor devices. After removing the silicon nitride spacers, approximately L shaped liners are left. However, this invention is not limited to an L shaped liner. It is to be understood that a mild etching process may be carried out to slightly etch the liner, thereby shrinking its thickness. In another case, the liner may be etched away. In general, the liners 30 and 130 have a thickness of about 0 to 500 angstroms.

Figure 8:
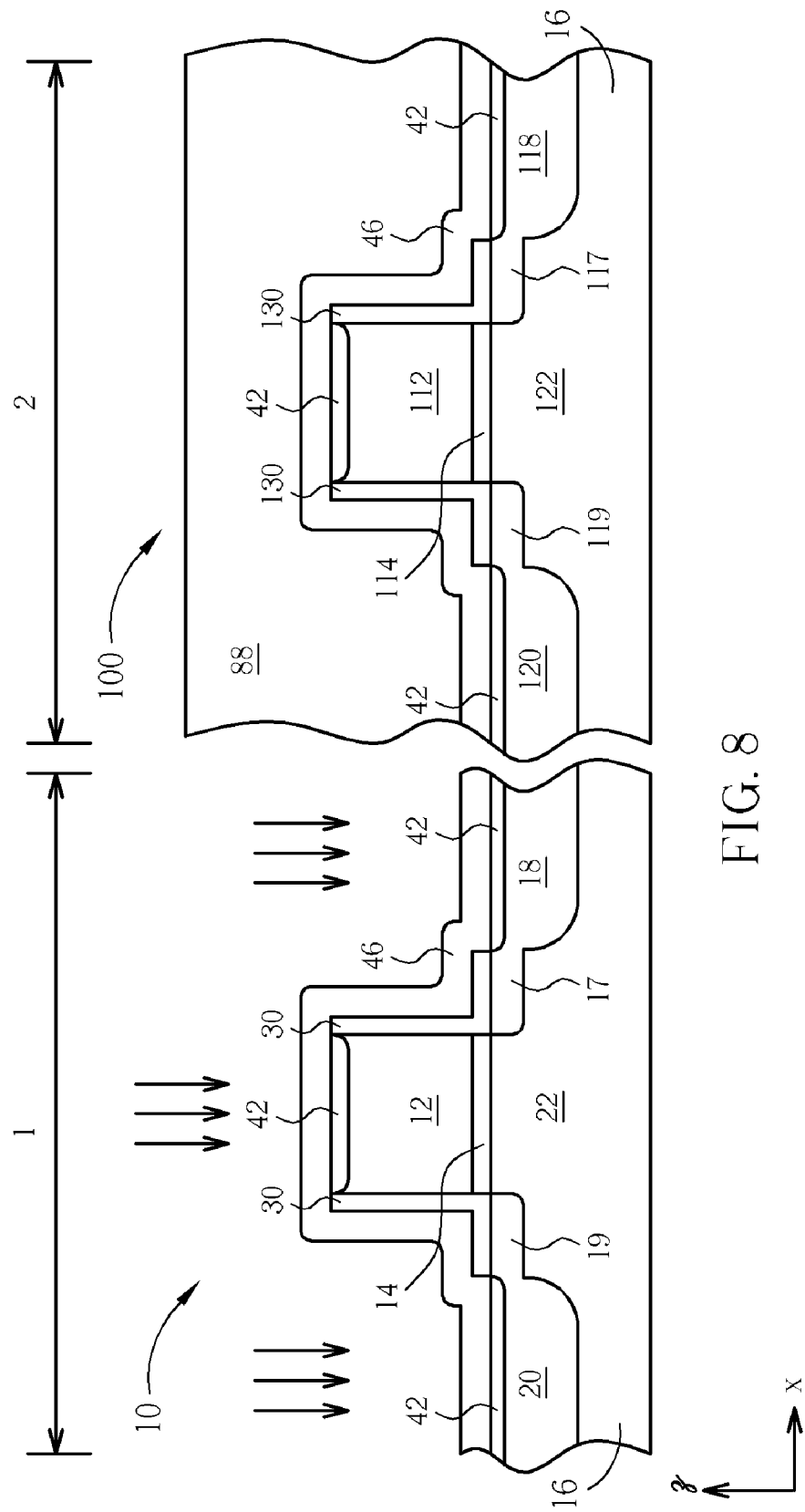

As shown in FIG. 8, in accordance with one preferred embodiment, a conformal silicon nitride cap layer 46 is deposited on the substrate. Preferably, the silicon nitride cap layer 46 has a thickness of about 30~2000 angstroms. The silicon nitride cap layer 46 borders the liners 30 and 130 on the sidewalls of the gates 12 and 122 of the NMOS transistor device 10 and the PMOS transistor device 100, respectively. The silicon nitride cap layer 46 is initially deposited in a first stress status such as a compressive-stressed status (ex. −0.1 Gpa~−3 Gpa). The silicon nitride cap layer 46 within the region 2 is then masked by a mask layer 88.

The exposed silicon nitride cap layer 46 within the region 1 is altered to a second stress status that is opposite to the first stress status, i.e., a tensile-stressed status (ex. 0.1 Gpa~3 Gpa) in this case. By doing this, the channel region 22 is tensile-stressed by the silicon nitride cap layer 46, while the channel region 122 is compressively stressed by the silicon nitride cap layer 46, both in the aforesaid channel direction (x direction or x-axis). According to the preferred embodiment, the alteration of the stress status of the exposed silicon nitride cap layer 46 within the region 1 is accomplished by using a germanium ion implantation. However, it is to be understood that the alteration of the stress status of the exposed silicon nitride cap layer 46 within the region 1 may be accomplished by using other methods known to those skilled in the art.

Figure 9:
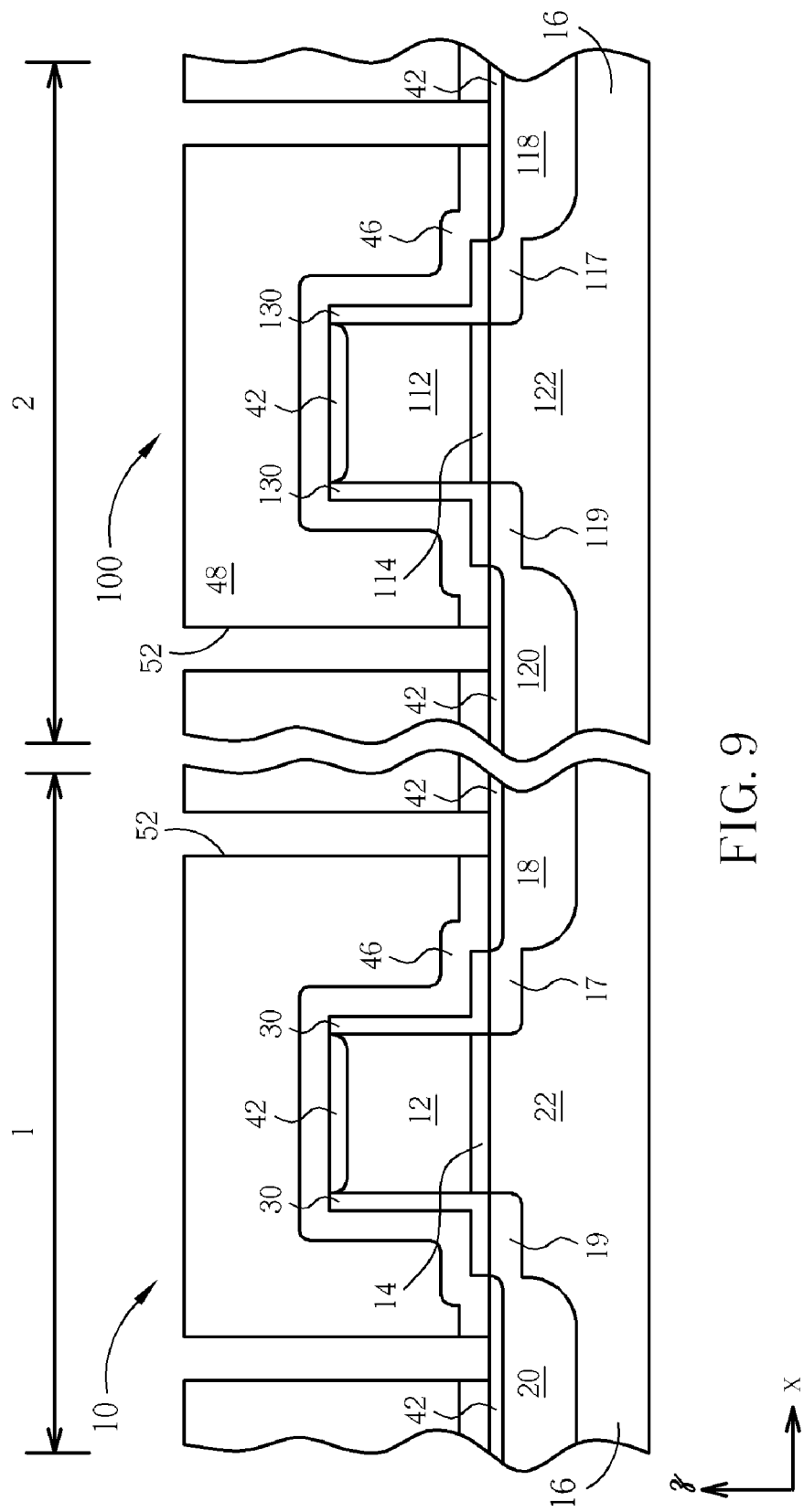

As shown in FIG. 9, subsequently, a dielectric layer 48 is deposited over the regions 1 and 2 on the silicon nitride cap layer 46. The dielectric layer 48 may be made of silicon oxide, doped silicon oxide or other suitable materials such as low-k materials. According to another embodiment of this invention, the dielectric layer 48 is stressed. For example, the dielectric layer 48 within region 1 is tensile-stressed, while the dielectric layer 48 within region 2 is compressively stressed. Conventional lithographic and etching processes are then carried out to form contact holes 52 in the dielectric layer 48 and in the silicon nitride cap layer 46. The contact holes 52 communicate with the source/drain regions of the devices 10 and 100. In another case, a contact hole may be formed to communicate with the gate electrode.

From one aspect of the present invention, the silicon nitride cap layer 46 acts as an etching stop layer during the dry etching of the contact holes 52 for alleviating surface damages caused by the etchant substances.

It is advantageous to use the present invention method because the NMOS transistor 10 is capped with a tensile-stressed silicon nitride cap layer and the PMOS transistor device is capped with a compressive-stressed silicon nitride cap layer. Since the silicon nitride spacers are removed, the stressed silicon nitride cap layer is therefore disposed more closer with the channels 22 and 122 of the devices 10 and 100, respectively, resulting in improved performance in terms of increased saturation current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a metal-oxide semiconductor (MOS) transistor device, comprising:
   providing a semiconductor substrate having a main surface;
   forming a gate dielectric layer on the main surface;
   forming a gate electrode on the gate dielectric layer, wherein the gate electrode has vertical sidewalls and a top surface;
   forming a liner on the vertical sidewalls of the gate electrode; wherein the liner is made of silicon oxide;
   forming a silicon nitride spacer on the liner;
   ion implanting the main surface using the gate electrode and the silicon nitride spacer as an implantation mask, thereby forming a source/drain region of the MOS transistor device in the main surface;
   removing the silicon nitride spacer; and
   forming a cap layer that borders the liner, wherein the cap layer has a specific stress status: wherein the MOS transistor device is an NMOS transistor device and wherein the cap layer is tensile-stressed.

2. The method of manufacturing a MOS transistor device according to claim 1 wherein the cap layer is made of silicon nitride.

3. The method of manufacturing a MOS transistor device according to claim 1 further comprising the step of forming a source/drain extension under the liner.

4. The method of manufacturing a MOS transistor device according to claim 1 further comprising the step of forming a salicide layer on the source/drain region.

5. The method of manufacturing a MOS transistor device according to claim 1 further comprising the step of annealing the source/drain region.

6. The method of manufacturing a MOS transistor device according to claim 1 wherein the cap layer has a thickness of about 30~2000 angstroms.

7. The method of manufacturing a MOS transistor device according to claim 1 wherein the cap layer acts as an etching stop layer during etching of a contact hole.

8. A method of manufacturing a (MOS) transistor device, comprising:
   providing a semiconductor substrate having a main surface;
   forming a gate dielectric layer on the main surface;
   forming a gate electrode on the gate dielectric layer, wherein the gate electrode has vertical sidewalls and a top surface;
   forming a liner on the vertical sidewalls of the gate electrode; wherein the liner is made of silicon oxide;
   forming a silicon nitride spacer on the liner;
   ion implanting the main surface using the gate electrode and the silicon nitride spacer as an implantation mask, thereby forming a source/drain region of the MOS transistor device in the main surface;
   removing the silicon nitride spacer; and
   forming a cap layer that borders the liner, wherein the cap layer has a specific stress status: wherein the MOS transistor device is an PMOS transistor device and wherein the cap layer is compressive-stressed.

* * * * *